(12) United States Patent
Xie et al.

(10) Patent No.: US 11,195,911 B2
(45) Date of Patent: Dec. 7, 2021

(54) BOTTOM DIELECTRIC ISOLATION STRUCTURE FOR NANOSHEET CONTAINING DEVICES

(71) Applicant: International Business Machines Corporation, Armonk, NY (US)

(72) Inventors: Ruilong Xie, Niskayuna, NY (US); Xin Miao, Slingerlands, NY (US); Takashi Ando, Eastchester, NY (US); Jingyun Zhang, Albany, NY (US)

(73) Assignee: International Business Machines Corporation, Armonk, NY (US)

(*) Notice: Subject to any disclaimer, the term of this patent is extended or adjusted under 35 U.S.C. 154(b) by 167 days.

(21) Appl. No.: 16/725,540

(22) Filed: Dec. 23, 2019

(65) Prior Publication Data
US 2021/0193797 A1    Jun. 24, 2021

(51) Int. Cl.
*H01L 29/06*    (2006.01)
*H01L 29/08*    (2006.01)
*H01L 21/02*    (2006.01)
*H01L 21/762*    (2006.01)
*H01L 21/8234*    (2006.01)

(52) U.S. Cl.
CPC ...... *H01L 29/0653* (2013.01); *H01L 21/0259* (2013.01); *H01L 21/762* (2013.01); *H01L 21/823418* (2013.01); *H01L 29/0665* (2013.01); *H01L 29/0843* (2013.01)

(58) Field of Classification Search
CPC ............. H01L 29/0653; H01L 21/0259; H01L 21/762; H01L 21/823418; H01L 29/0665; H01L 29/0843; H01L 29/0669–068; H01L 29/7853–2029/7858; H01L 29/78687; H01L 29/78696
See application file for complete search history.

(56) References Cited

U.S. PATENT DOCUMENTS

| 3,508,980 A | 4/1970 | Jackson, Jr. et al. |
| 4,139,442 A | 2/1979 | Bondur et al. |
| 5,354,695 A | 10/1994 | Leedy |
| 6,008,126 A | 12/1999 | Leedy |

(Continued)

FOREIGN PATENT DOCUMENTS

CN    107689394 A    2/2018

OTHER PUBLICATIONS

Jurczak, M., et al., "Silicon-on-Nothing (SON)—an Innovative Process for Advanced CMOS", IEEE Transactions on Electron Devices, Nov. 2000, pp. 2179-2187, vol. 47, No. 11.

(Continued)

*Primary Examiner* — Scott B Geyer
(74) *Attorney, Agent, or Firm* — Scully, Scott, Murphy & Presser, P.C.; L. Jeffrey Kelly, Esq.

(57) ABSTRACT

A semiconductor structure is provided that includes nanosheet containing devices having a bottom dielectric isolation structure and high quality source/drain (S/D) structures. In the present application, the bottom dielectric isolation structure is formed after the S/D structures to ensure high quality epitaxy for both long channel and short channel nanosheet containing devices. The bottom dielectric isolation structure of the present application has a first portion that is located beneath each nanosheet stack and a second portion that is located in a single diffusion break point trench.

20 Claims, 16 Drawing Sheets

(56) References Cited

U.S. PATENT DOCUMENTS

| | | |
|---|---|---|
| 8,609,510 B1 | 12/2013 | Banna et al. |
| 8,846,491 B1 | 9/2014 | Pham et al. |
| 9,171,752 B1 | 10/2015 | Wu et al. |
| 9,368,496 B1 | 6/2016 | Yu et al. |
| 9,865,704 B2 | 1/2018 | Xie et al. |
| 9,917,103 B1 | 3/2018 | Mulfinger et al. |
| 9,947,804 B1 | 4/2018 | Frougier et al. |
| 9,984,936 B1 * | 5/2018 | Xie .................. B82Y 10/00 |
| 10,103,238 B1 * | 10/2018 | Zang ................ H01L 29/1079 |
| 10,141,228 B1 | 11/2018 | Lin et al. |
| 10,177,151 B1 | 1/2019 | Wang et al. |
| 10,840,146 B1 * | 11/2020 | Paul ................ H01L 29/42392 |
| 2009/0032874 A1 | 2/2009 | Loubet et al. |
| 2014/0353718 A1 | 12/2014 | Loubet et al. |
| 2016/0254180 A1 | 9/2016 | Liu et al. |
| 2019/0165118 A1 * | 5/2019 | Leobandung ....... H01L 29/0847 |
| 2019/0229011 A1 * | 7/2019 | Suk .................. H01L 29/66553 |
| 2019/0341448 A1 * | 11/2019 | Bourjot .............. H01L 29/0653 |
| 2020/0357884 A1 * | 11/2020 | Xie ................ H01L 21/823481 |
| 2020/0365687 A1 * | 11/2020 | Xie ................ H01L 21/823481 |
| 2021/0043727 A1 * | 2/2021 | Frougier ........... H01L 29/66553 |
| 2021/0074809 A1 * | 3/2021 | Xie .................. H01L 29/66545 |
| 2021/0083127 A1 * | 3/2021 | Xie .................. H01L 29/42392 |
| 2021/0119031 A1 * | 4/2021 | Song ............... H01L 21/823871 |
| 2021/0151566 A1 * | 5/2021 | Zhang ................ H01L 29/267 |
| 2021/0151607 A1 * | 5/2021 | Miao .............. H01L 21/823412 |

OTHER PUBLICATIONS

Jacob, A. P., et al., "Scaling Challenges for Advanced CMOS Devices", International Journal of High Speed Electronics and Systems, Accepted Dec. 26, 2016, 76 pages, vol. 26, Nos. 1 & 2, World Scientific Publishing Company.

* cited by examiner

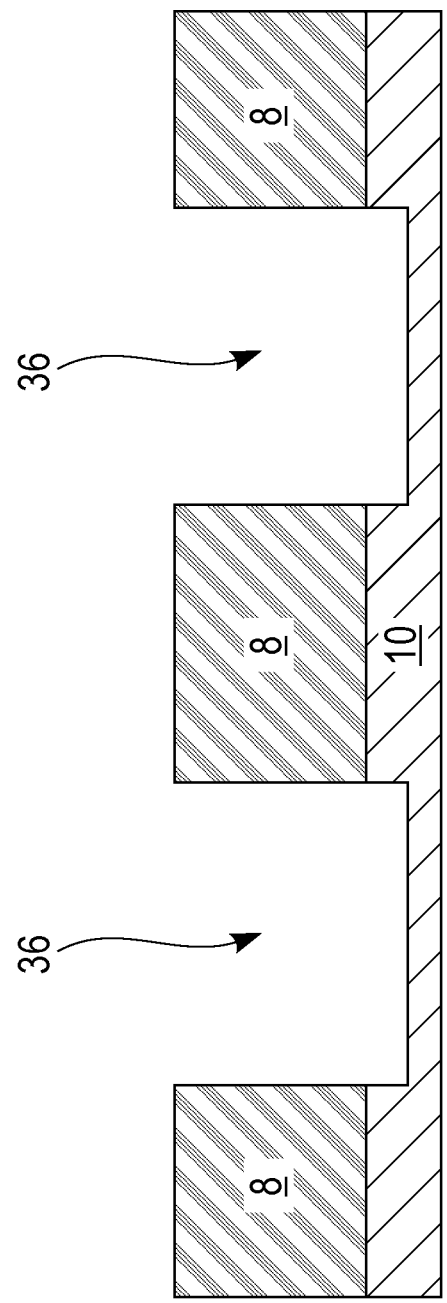

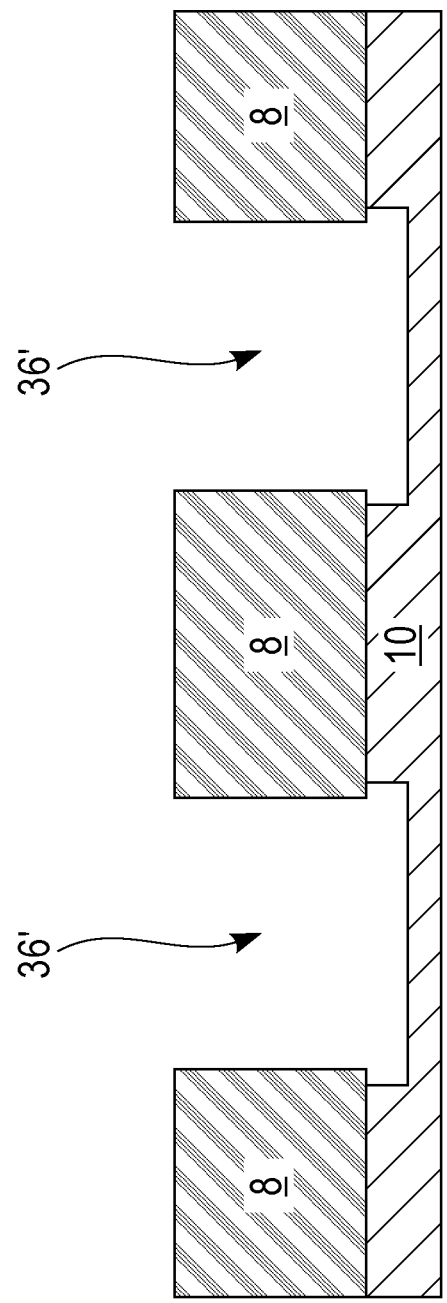

BOTTOM DIELECTRIC ISOLATION STRUCTURE FOR NANOSHEET CONTAINING DEVICES

BACKGROUND

The present application relates to semiconductor technology, and more particularly, to a semiconductor structure including nanosheet containing devices having a bottom dielectric isolation structure and high quality source/drain structures, and a method of forming the same.

The use of non-planar semiconductor devices is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

In nanosheet containing devices, full bottom dielectric isolation is needed to shut-off the substrate leakage path in both the source/drain region and under the channel region. However, the current full bottom dielectric isolation processing scheme causes source/drain (S/D) epitaxy issues for both long channel devices and short channel devices. For example, and for long channel devices, the S/D epitaxy would be un-merged making the contact structure miss landing on the S/D epi layers. For short channel devices, the S/D epitaxy is degraded because if epitaxy merger happens first for the top nanosheets, any nanosheet sheet below could have poor epitaxy growth.

There is a need for providing nanosheet containing devices containing full bottom dielectric isolation and high quality source/drain structures.

SUMMARY

A semiconductor structure is provided that includes nanosheet containing devices having a bottom dielectric isolation structure and high quality source/drain (S/D) structures. By "high quality S/D structures" it is meant that there is no missing epi defects (i.e., there is no epi material formed over some of the nanosheets). In the present application, the bottom dielectric isolation structure is formed after the S/D structures to ensure high quality epitaxy for both long channel and short channel nanosheet containing devices. By "high quality epitaxy" it is meant that there is no massive epi stacking faults. The bottom dielectric isolation structure of the present application has a first portion that is located beneath each nanosheet stack and a second portion that is located in a single diffusion break point trench.

In one aspect of the present application, a semiconductor structure is provided. In one embodiment, the semiconductor structure includes a plurality of nanosheet stacks composed of suspended semiconductor channel material nanosheets located above a semiconductor substrate, wherein a single diffusion break point trench is present in the semiconductor substrate and separates a first set of nanosheet stacks of the plurality of nanosheet stacks from a second set of nanosheet stacks of the plurality of nanosheet stacks. A functional gate structure surrounds a portion of each semiconductor channel material nanosheet of the plurality of nanosheet stacks. An epitaxial source/drain (S/D) structure is located on each side of the functional gate structure and physically contacts a sidewall of each semiconductor channel material nanosheet of the plurality of nanosheet stacks. A bottom dielectric isolation structure is located beneath each of the nanosheet stacks of the plurality of nanosheet stacks and is present in the single diffusion break point trench.

In another aspect of the present application, a method of forming a semiconductor structure is provided. In one embodiment, the method includes forming a plurality of sacrificial gate structures on at least one nanosheet structure that is present on a surface of a semiconductor substrate, wherein the at least one nanosheet structure is composed of a vertical stack of alternating sacrificial semiconductor material layers and semiconductor channel material layers. Next, a portion of the at least one nanosheet structure is recessed to provide a plurality of nanosheet stacks of alternating sacrificial semiconductor material nanosheets and semiconductor channel material nanosheets. Each sacrificial semiconductor material nanosheet is then recessed to provide recessed sacrificial semiconductor nanosheets. Next, an epitaxial semiconductor buffer layer is formed on an exposed surface of a bottommost semiconductor channel material layer of the at least one nanosheet structure that is located between each nanosheet stack, and thereafter an epitaxial source/drain structure is formed on the epitaxial semiconductor buffer layer. One of the sacrificial gate structures, the underlying nanosheet stack, the underlying bottommost semiconductor channel material layer and the underlying bottommost sacrificial material layer are then removed to expose a portion of the semiconductor substrate and thereafter a single diffusion break point trench is formed in the semiconductor substrate by etching the exposed portion of the semiconductor substrate. Next, the remaining bottommost sacrificial semiconductor material layer of the nanosheet structure is removed to provide a cavity beneath the remaining nanosheet stacks. A bottom dielectric isolation structure is then formed in the single diffusion break point trench and the cavity that is present beneath the remaining nanosheet stacks.

BRIEF DESCRIPTION OF THE DRAWINGS

FIG. 8B is a Y-Y cross sectional view of the exemplary structure of FIG. 8A.

FIG. 10B is a Y-Y cross sectional view of the exemplary structure of FIG. 10A.

DETAILED DESCRIPTION

Figure 1:
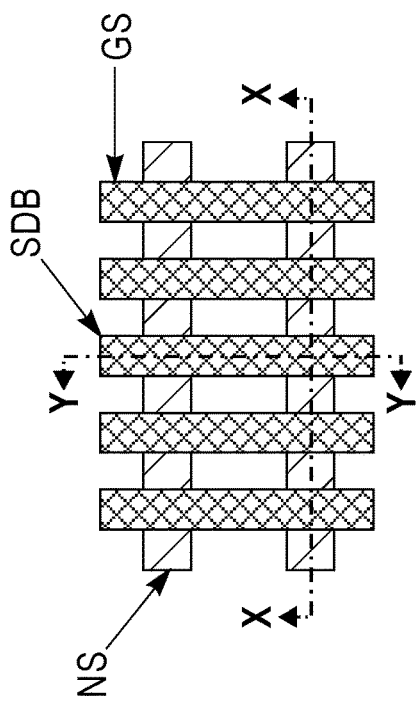
FIG. 1 is a diagram showing the various cross sections that will be illustrated in the present application; X-X is a cross section along a lengthwise direction of a nanosheet structure, and Y-Y is a cross section along the length wise direction of a gate structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Reference is first made to FIG. 1, which is a diagram showing the various cross sections that will be illustrated in the remaining drawings of the present application. Notably, X-X is a cross section along a lengthwise direction of a nanosheet structure (NS), and Y-Y is a cross section along the length wise direction of a gate structure (GS); in the present application the gate structure includes a sacrificial gate structure which is then replaced with a functional gate structure. In FIG. 1, SDB denotes an area in which a single diffusion break (SDB) region and SDB trench will be subsequently formed. In FIG. 1, gate structures (GS) are shown which straddle over different portions of each nanosheet structure (NS). The gate structures (GS) are oriented perpendicular to each nanosheet structure (NS). Although FIG. 1 illustrates two nanosheet structures and five sacrificial gate structures, the present application is not limited to that number of nanosheet structures and gate structures.

Figure 2A:
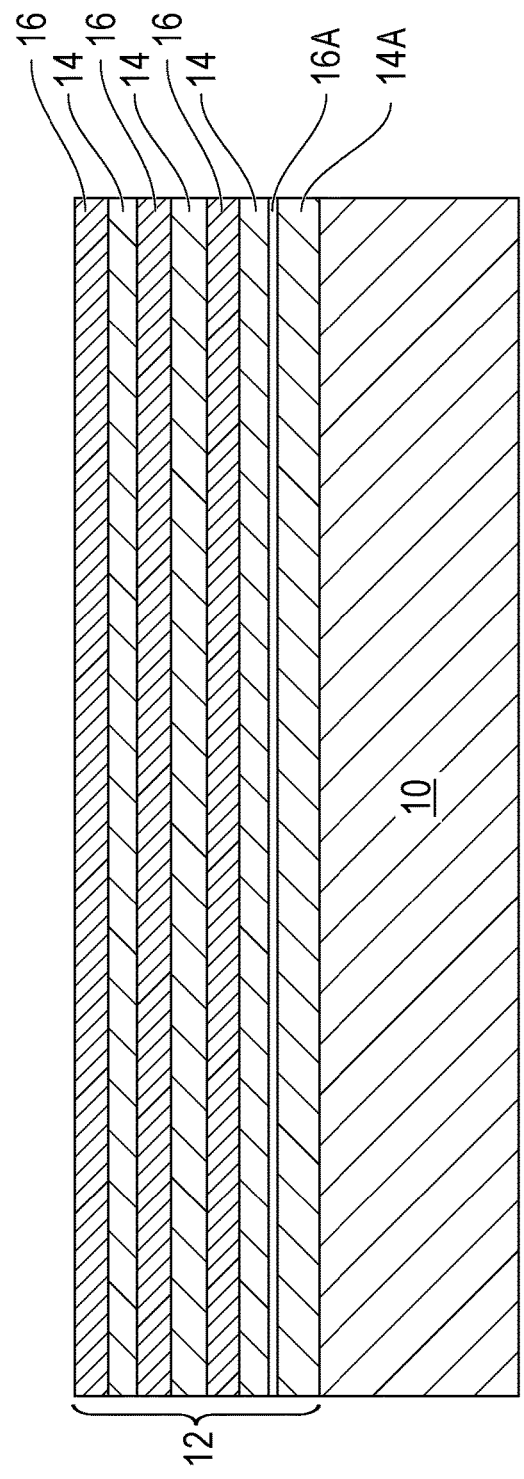
FIG. 2A is a X-X cross sectional view of an exemplary structure that can be employed in one embodiment of the present application, the exemplary structure includes at least one nanosheet structure located on a surface of a semiconductor substrate and composed of a vertical stack of alternating sacrificial semiconductor material layers and semiconductor channel material layers.
Figure 2B:
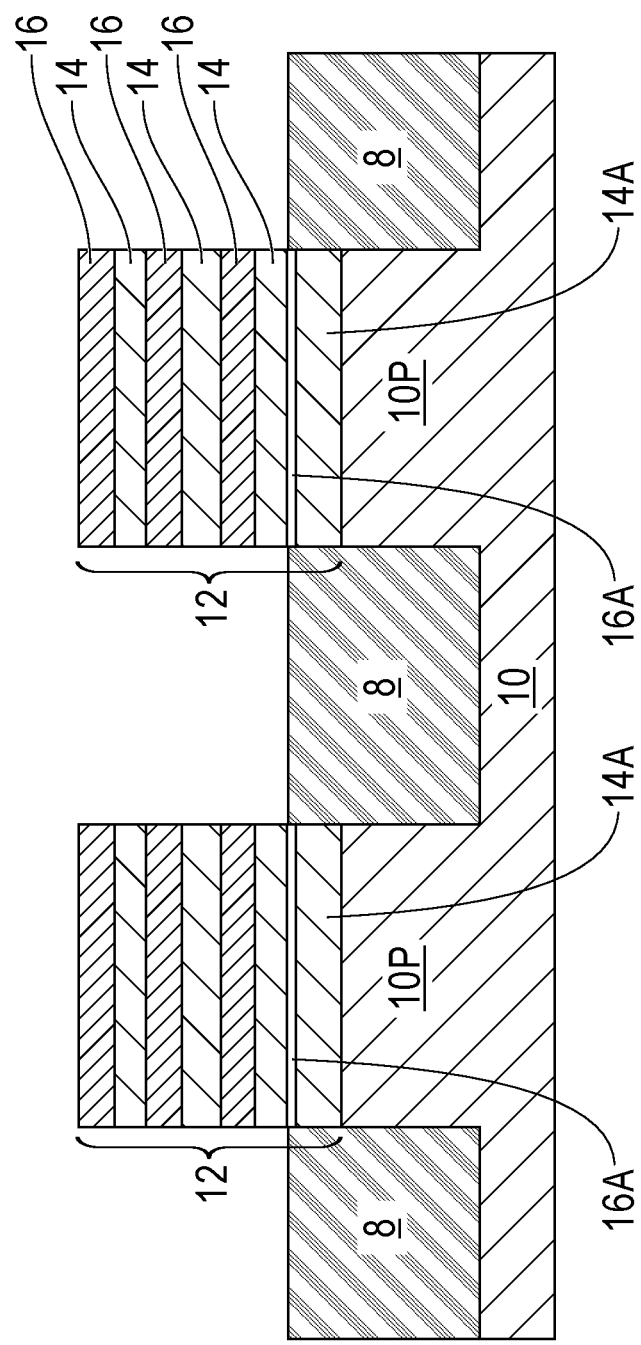
FIG. 2B is a Y-Y cross sectional view of the exemplary structure shown in FIG. 2A.

Referring now to FIGS. 2A-2B, there are shown through various cross sectional views an exemplary structure that can be employed in one embodiment of the present application. Specifically, the exemplary structure of FIGS. 2A-2B includes at least one nanosheet structure 12 located on a surface of a semiconductor substrate 10. The at least one nanosheet structure 12 is composed of a vertical stack of alternating sacrificial semiconductor material layers and semiconductor channel material layers. The term "nanosheet structure" is used in the present application to define a structure that includes a nanosheet stack consists of a few layers of semiconductor sacrificial and channel materials and being patterned and etched with a pair of vertical sidewalls that are parallel to each other. A surface is "vertical" if there exists a vertical plane from which the surface does not deviate by more than three times the root mean square roughness of the surface. In the present application, each nanosheet structure 12 includes a bottommost sacrificial semiconductor material layer 14A and at least two sacrificial semiconductor layers 14 located above the bottommost sacrificial semiconductor layer 14A. Each nanosheet structure 12 also includes a bottommost semiconductor channel material layer 16A and at least two other semiconductor channel material layers 16 located above the bottommost semiconductor channel material layer 16A.

The semiconductor substrate 10 is composed of any semiconductor material having semiconducting properties. Illustrative examples of semiconductor materials that can be used as the semiconductor substrate 10 include, but are not limited to, silicon (Si), germanium (Ge), a silicon germanium alloy (SiGe), silicon carbide (SiC), silicon germanium carbide (SiGeC), a III-V compound semiconductor or a II-VI compound semiconductor. The semiconductor substrate 10 can include mesa portions 10P as shown in FIG. 2B which can be formed during the formation of the nanosheet structure 12. By "mesa portions" it is meant that a material has isolated regions having a relatively planar topmost surface that extend upward from a base portion of the material.

The at least one nanosheet structure 12 can be formed by first providing a semiconductor material stack (not shown) of alternating sacrificial semiconductor material layers (14A, 14) and semiconductor channel material layers (16A, 16). Next, the semiconductor material stack is patterned to provide the at least one nanosheet structure 12. The patterning can include, for example, lithography and etching, a sidewall image transfer (SIT) process, or a direct self-assembly (DSA) patterning process. During the formation of the nanosheet structure 12, portions of the semiconductor substrate 10 can also be removed to provide a semiconductor substrate 10 having mesa portions 10P.

Each sacrificial semiconductor material layer (14A, 14) is composed of a first semiconductor material which differs in composition from at least an upper portion of the semiconductor substrate 10. In one embodiment, the upper portion of the semiconductor substrate 10 is composed of silicon, while each sacrificial semiconductor material layer (14A, 14) is composed of a silicon germanium alloy. The first semiconductor material that provides each sacrificial semiconductor material layer (14A, 14) can be formed utilizing an epitaxial growth (or deposition process) as defined in greater detail herein below.

Each semiconductor channel material layer (16A, 16) is composed of a second semiconductor material that has a different etch rate than the first semiconductor material that provides the sacrificial semiconductor material layers (14A, 14). The second semiconductor material that provides each semiconductor channel material layer (16A, 16) can be the same as, or different from, the semiconductor material that provides at least the upper portion of the semiconductor substrate 10. In one example, at least the upper portion of the semiconductor substrate 10 and each semiconductor channel material layer (16A, 16) are composed of Si or a III-V compound semiconductor, while each sacrificial semiconductor material layer (14A, 14) is composed of a silicon germanium alloy. The second semiconductor material that provides each semiconductor channel material layer (16A, 16) can be formed utilizing an epitaxial growth (or deposition process) as defined in greater detail herein below.

The semiconductor material stack can be formed by sequential epitaxial growth of alternating layers of the first semiconductor material, as defined above, and the second semiconductor material, as defined above. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition can result in crystal defects and film cracking. The epitaxial growth the first and second semiconductor materials that provide the sacrificial semiconductor material layers and the semiconductor channel material layers, respectively, can be performed utilizing any well known precursor gas or gas mixture. Carrier gases like hydrogen, nitrogen, helium and argon can be used.

In the present application, the bottommost sacrificial semiconductor material layer 14A and the bottommost semiconductor channel material layer 16A are not used in forming a nanosheet stack, instead the bottommost sacrificial semiconductor material layer 14A and the bottommost semiconductor channel material layer 16A are entirely sacrificial layers. Also and in some embodiments of the present application, the bottommost semiconductor channel material layer 16A has a thickness than is less than the thickness of the other semiconductor channel material layers 16. The use of a thin bottommost semiconductor channel material layer 16A does not significantly increase the height of the nanosheet structure 12 thus alleviating any burden in the nanosheet structure and gate patterning.

In some embodiments, and after forming the at least one nanosheet structure 12, a shallow trench isolation (STI) structure 8 is formed. The STI structure 8 is formed laterally adjacent a lower portion of each nanosheet structure 12, and, if present, laterally adjacent to each mesa portion 10P of the semiconductor substrate 10. The STI structure 8 can be formed by depositing a trench dielectric material such as, for example, silicon dioxide, and thereafter recessing the deposited trench dielectric material.

Figure 3A:
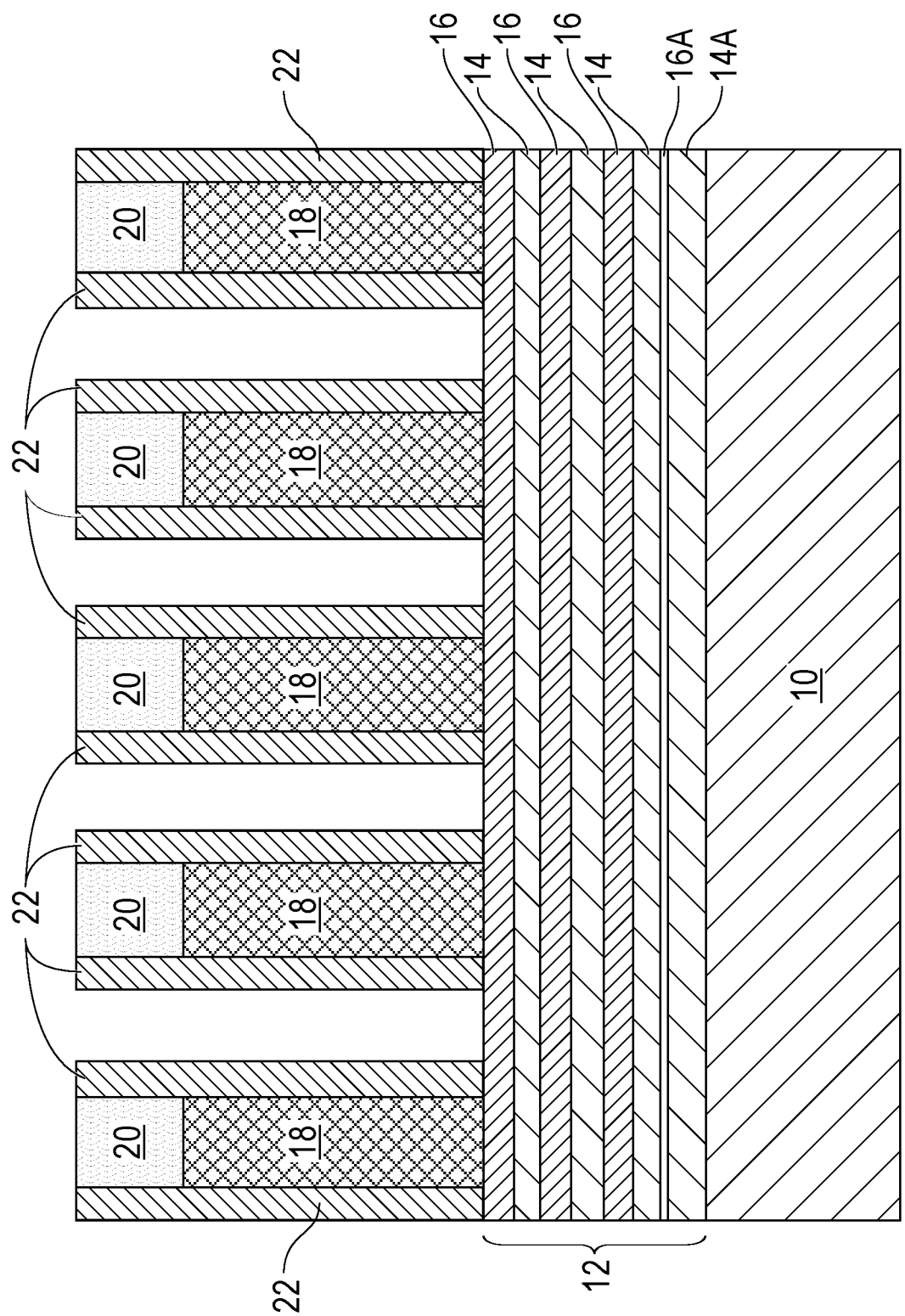
FIG. 3A is a X-X cross sectional view of the exemplary structure of FIG. 2A after forming a plurality of sacrificial gate structures on the at least one nanosheet structure, wherein a gate dielectric spacer is located on a sidewall of each sacrificial gate structure of the plurality of sacrificial gate structures.
Figure 3B:
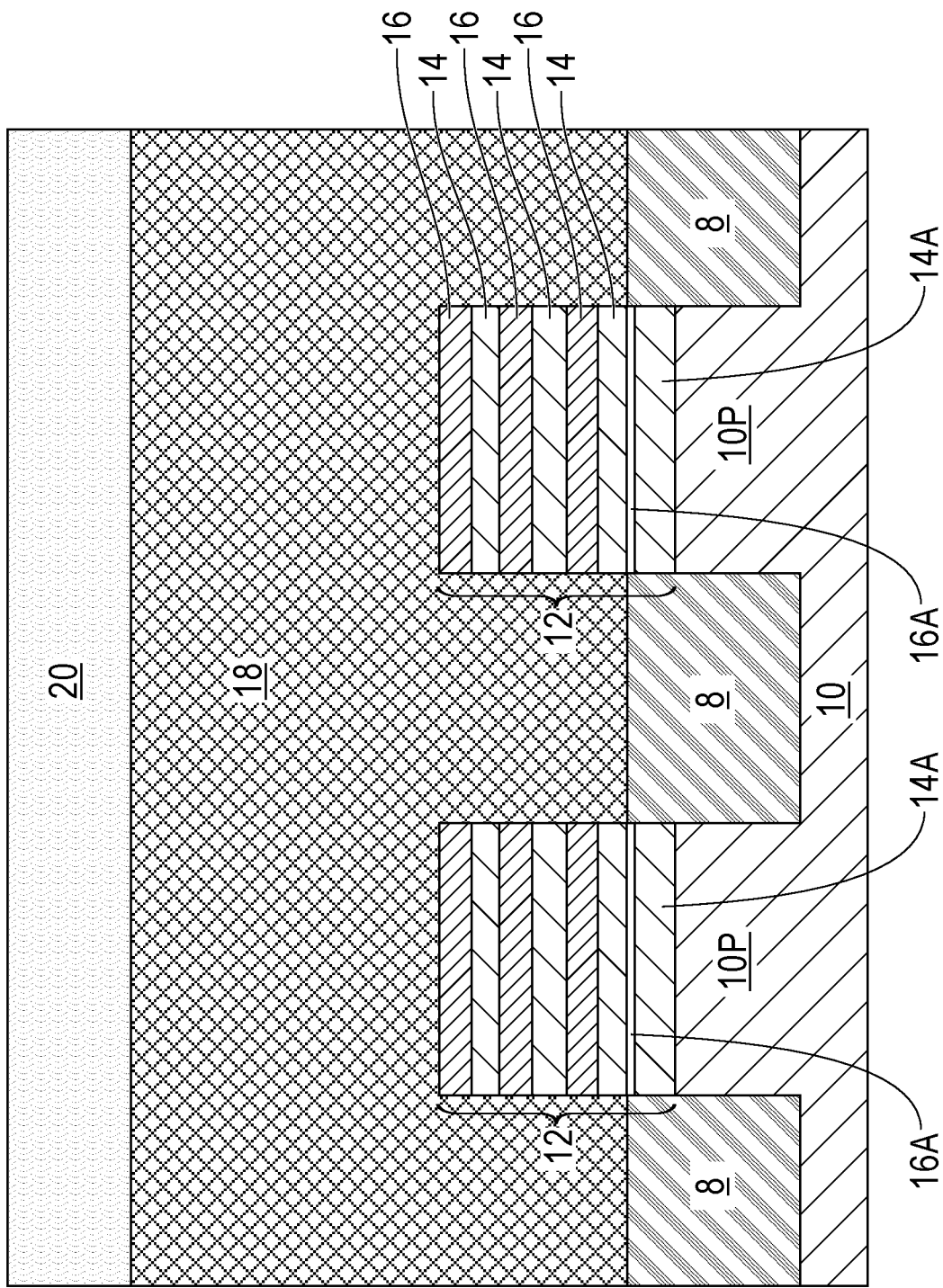
FIG. 3B is a Y-Y cross sectional view of the exemplary structure shown in FIG. 3A.

Referring now to FIGS. 3A-3B, there are shown the exemplary structure of FIGS. 2A-2B after forming a plurality of sacrificial gate structures on the at least one nanosheet structure 12, wherein a gate dielectric spacer 22 is located on a sidewall of each sacrificial gate structure of the plurality of sacrificial gate structures; in the illustrated embodiment of the present application each gate structure is labeled as (18, 20). By way of illustration, five sacrificial gate structures (18, 20) are exemplified in the drawings of the present application. Each sacrificial gate structure (18, 20) is located on a first side and a second side of the at least one nanosheet structure 12 and spans across a topmost surface of a portion of the at least one nanosheet structure 12. Each sacrificial gate stack (18, 20) thus straddles over a portion of the at least one nanosheet structure 12. The gate dielectric spacer 22 is present on sidewalls of each sacrificial gate structure; the gate dielectric spacer 22 thus also straddles over the at least one nanosheet structure 12.

Each sacrificial gate structure (18, 20) can include a single sacrificial material portion or a stack of two or more sacrificial material portions (i.e., at least one sacrificial material portion). In one embodiment, the at least one sacrificial material portion comprises, from bottom to top, a sacrificial gate dielectric portion (not shown), a sacrificial gate portion 18 and a sacrificial dielectric cap portion 20. In some embodiments, the sacrificial gate dielectric portion and/or the sacrificial dielectric cap portion 20 can be omitted and only a sacrificial gate portion 18 is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than 4.0. In some embodiments, a multi-layered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material or instead of forming the blanket layer of sacrificial gate dielectric material, a blanket layer of a sacrificial gate material can be formed. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, CVD, PECVD, PVD, sputtering, ALD or other like deposition processes.

After forming the blanket layer of sacrificial gate material, a blanket layer of a sacrificial gate cap material can be formed. The sacrificial gate cap material can include a hard mask material such as, for example, silicon dioxide and/or silicon nitride. The sacrificial gate cap material can be formed by any suitable deposition process such as, for example, CVD or PECVD.

After providing the above mentioned sacrificial material stack (or any subset of the sacrificial materials), lithography and etching can be used to pattern the sacrificial material stack (or any subset of the sacrificial materials) and to provide the sacrificial gate structures (18, 20). The remaining portions of the sacrificial gate dielectric material constitute a sacrificial gate dielectric portion (not shown), the remaining portions of the sacrificial gate material constitute a sacrificial gate portion 18, and the remaining portions of the sacrificial dielectric cap material constitute a sacrificial dielectric cap portion 20.

After providing the sacrificial gate structure (18, 20), the gate dielectric spacer 22 can be formed on the exposed sidewalls of each sacrificial gate structure (18, 20). The gate dielectric spacer 22 can be formed by first providing a dielectric spacer material and then etching the dielectric spacer material. One example of a dielectric spacer material that can be employed in the present application is silicon nitride. The dielectric spacer material that provides the gate dielectric spacer 22 can be provided by a deposition process including, for example, CVD, PECVD, or PVD. The etch used to provide the gate dielectric spacer 22 can include a dry etching process such as, for example, reactive ion etching.

It is noted that in the drawings of the present application, the sacrificial gate structures (18, 20) and gate dielectric spacer 22 are only shown as being present atop, not along sidewalls, of the at least one nanosheet structure 12. This was done for clarity and to illustrate the nanosheet stack that is formed beneath the sacrificial gate structures (18, 20) and the gate dielectric spacers 22.

Figure 4:
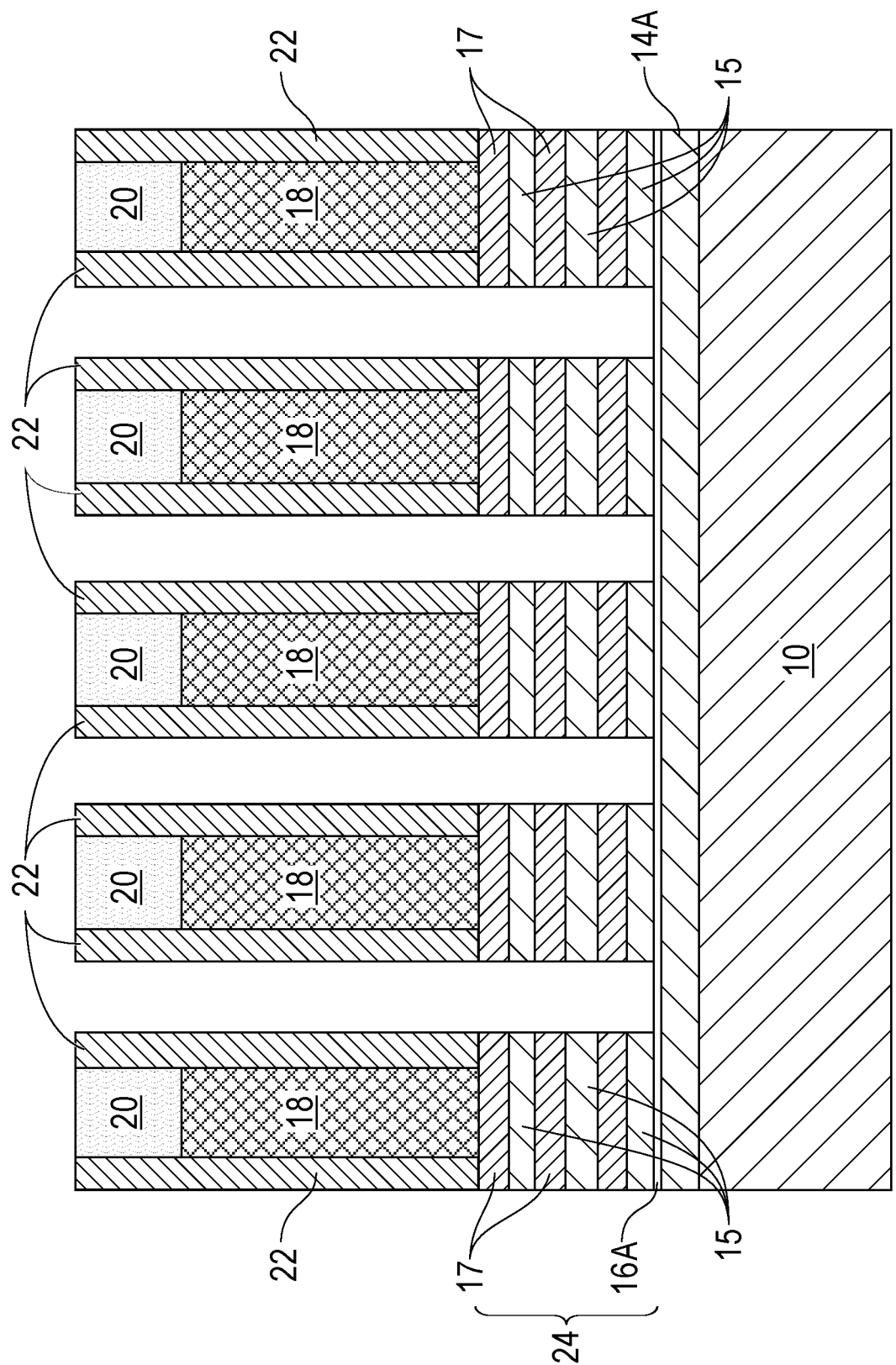
FIG. 4 is a X-X cross sectional view of the exemplary structure of FIG. 3A after recessing a portion of the at least one nanosheet structure to provide at least one nano sheet stack of alternating sacrificial semiconductor material nanosheets and semiconductor channel material nanosheets.

Referring now to FIG. 4, there is shown the exemplary structure of FIGS. 3A-3B after recessing a portion of the at least one nanosheet structure 12 to provide at least one nanosheet stack 24 of alternating sacrificial semiconductor material nanosheets 15 and semiconductor channel material nanosheets 17. The recessing does not remove the entirety of the nanosheet structure 12. Notably, the recessing does not remove the bottommost semiconductor channel material layer 16A and the bottommost sacrificial semiconductor material layer 14A of the original nanosheet structure 12. The recessing can stop on a topmost surface of the bottommost semiconductor channel material layer 16A or the recessing can stop within a portion of the sacrificial semiconductor material that is located directly on the bottommost semiconductor channel material layer 16A.

Recessing can be performed utilizing an anisotropic etching process such as, for example, a reactive ion etch (RIE). Portions of the at least one nanosheet structure 12 remain beneath the sacrificial gate structures (18, 20) and the gate dielectric spacers 22 and provide nanosheet stacks 24. Notably, portions of the sacrificial semiconductor material layers 14 and portions of the semiconductor channel material layers 16 remain beneath the sacrificial gate structures (18, 20) and the gate dielectric spacers 22 and provide nanosheet stacks 24. Each remaining portion of the sacrificial semiconductor material layers 14 that is located beneath the sacrificial gate structures (18, 20) and the gate dielectric spacers 22 constituents one of the sacrificial semiconductor material nanosheets 15 of the nanosheet stack 24, and each remaining portion of the semiconductor channel material layers 16 that is located beneath the sacrificial gate structures (18, 20) and the gate dielectric spacers 22 constituents one of the semiconductor channel material nanosheets 17 of the nanosheet stack 24.

At this point of the present application, and in some embodiments, the sidewalls of each sacrificial semiconductor material nanosheet 15 are vertically aligned to sidewalls of each semiconductor channel material nanosheet 17, and the vertically aligned sidewalls of the nanosheet stack 24 are vertically aligned to an outermost sidewall of the gate dielectric spacers 22.

Figure 5:
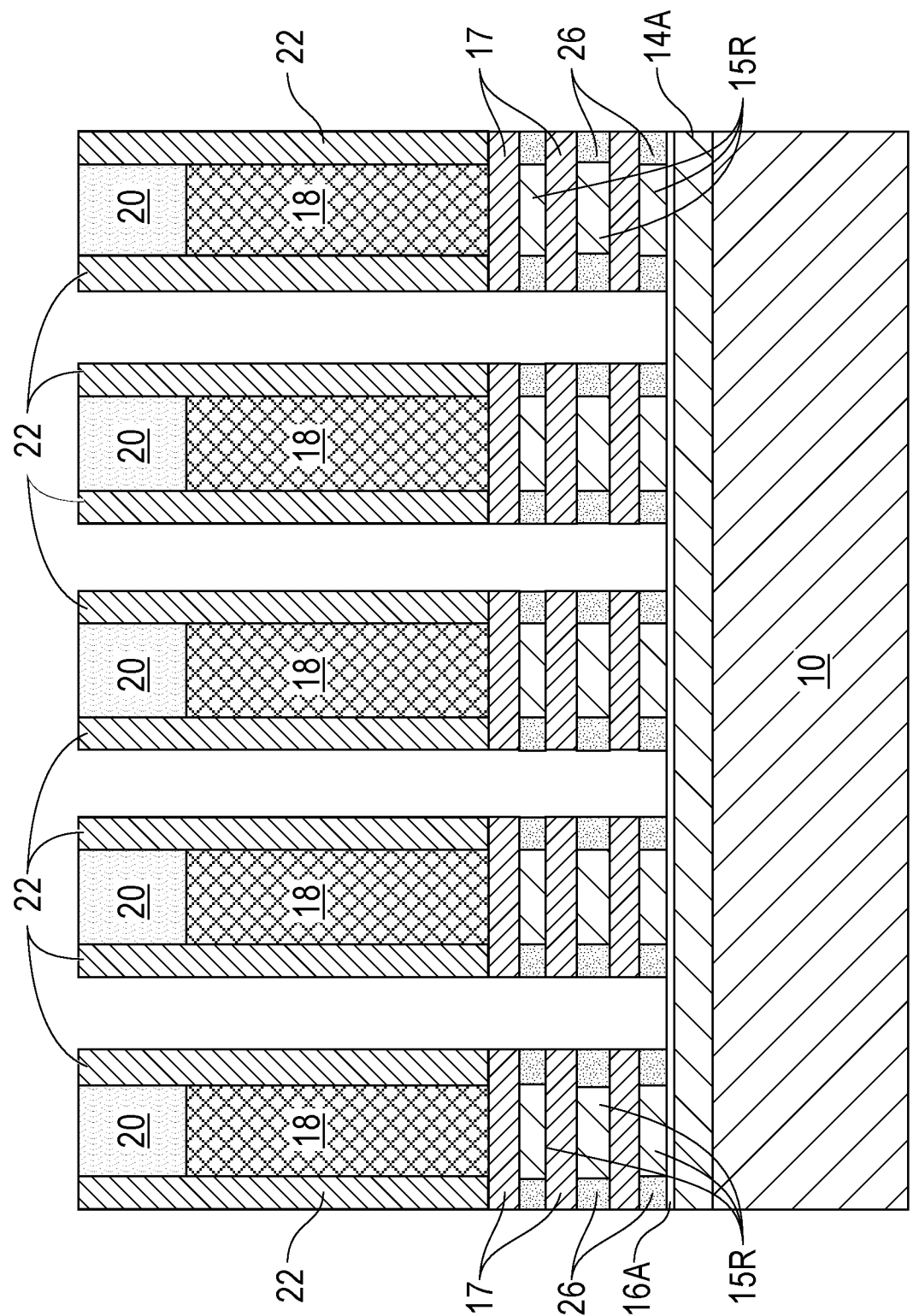
FIG. 5 is a X-X cross sectional view of the exemplary structure of FIG. 4 after recessing each sacrificial semiconductor material nanosheet and forming an inner spacer laterally adjacent to each recessed sacrificial semiconductor material nanosheet.

Referring now to FIG. 5, there is illustrated the exemplary structure of FIG. 4 after recessing each sacrificial semiconductor material nanosheet 15 and forming an inner spacer 26 laterally adjacent to each recessed sacrificial semiconductor material nanosheet. Each recessed sacrificial semiconductor material nanosheet 15 is designated as element 15R in the drawings of the present application. When the recessing step of FIG. 4 stopped within a portion of the sacrificial semiconductor material that is located directly on the bottommost semiconductor channel material layer 16A, this step of the present application can remove the remaining portion of the sacrificial semiconductor material that is located directly on the bottommost semiconductor channel material layer 16A.

Each recessed sacrificial semiconductor material nanosheet 15R has a width that is less than the original width of each sacrificial semiconductor material nanosheet 15. The recessing of each sacrificial semiconductor material nanosheet 15 provides a gap (not specifically shown) between each neighboring pair of semiconductor channel material nanosheets 17 within a given nanosheet stack 24. The recessing of each sacrificial semiconductor material nanosheet 15 includes a lateral etching process that is selective in removing physically exposed end portions of each sacrificial semiconductor material nanosheet 15 relative to each semiconductor channel material nanosheet 17.

The inner dielectric spacer 26 is then formed in the gap that is laterally adjacent to each recessed sacrificial semiconductor material nanosheet 15R. The inner dielectric spacer 26 is composed of a dielectric spacer material that can be compositionally the same as, or compositionally different from the dielectric spacer material that provides gate dielectric spacers 22. The inner dielectric spacer 26 can be formed by deposition of a conformal dielectric material and then performing an isotropic etch back.

Figure 6:
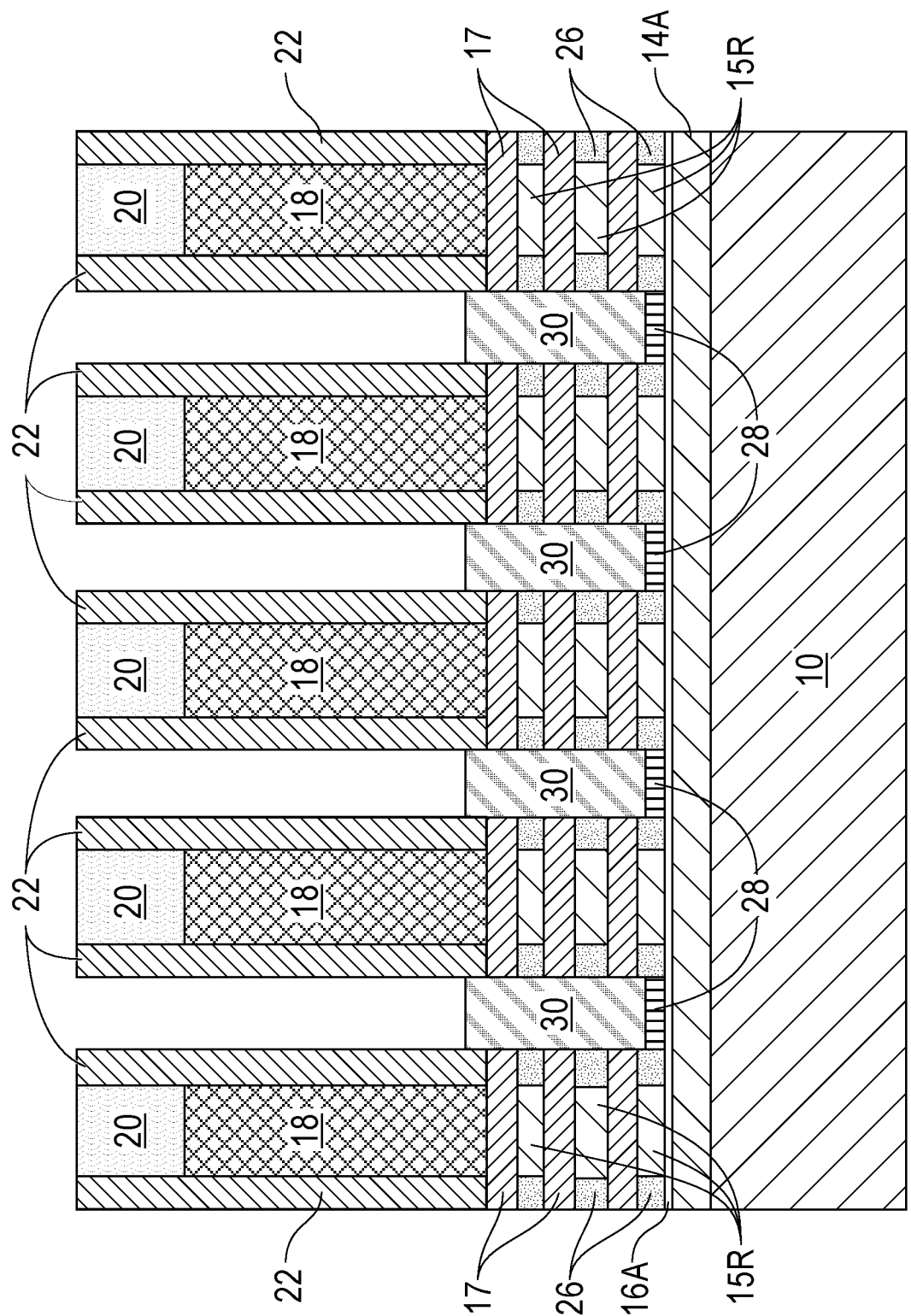
FIG. 6 is a X-X cross sectional view of the exemplary structure of FIG. 5 after forming a epitaxial semiconductor buffer layer on an exposed surface of a bottommost semiconductor channel material layer of the at least one nanosheet structure that is located between each nanosheet stack, and thereafter forming an epitaxial source/drain structure on the epitaxial semiconductor buffer layer.

Referring now to FIG. 6, there is illustrated the exemplary structure of FIG. 5 after forming an epitaxial semiconductor buffer layer 28 on an exposed surface of the bottommost semiconductor channel material layer 16A of the at least one nanosheet structure 12 that is located between each nanosheet stack 24, and thereafter forming an epitaxial source/drain structure 30 on the epitaxial semiconductor buffer layer 28. As is shown, the epitaxial semiconductor buffer layer 28 and the epitaxial source/drain structure 30 are formed in the gaps that are located laterally adjacent to each nanosheet stack 24. As is further shown, the epitaxial source/drain structure 30 contacts exposed sidewalls of the semiconductor channel material nanosheets 17 of each of the nanosheet stacks 24. The formation of the epitaxial semiconductor buffer layer 28 and the epitaxial source/drain structure 30 from the semiconductor substrate 10 lowers the defects and random missing source/drain epi issue, providing a lower source/drain resistance, and there is no need to maintain a minimum spacer between gates for epitaxial growth—good for some high performance devices with a larger critical poly pitch or some medium length channel devices.

Each of the epitaxial semiconductor buffer layer 28 and the epitaxial source/drain structure 30 is formed utilizing a bottom up epitaxial growth process. By "bottom up epitaxial growth" it is meant that a semiconductor material is epitaxially grown upward from an underlying semiconductor material layer. The bottom up epitaxial growth process used in forming both of the epitaxial semiconductor buffer layer 28 and the epitaxial source/drain structure 30 includes one of the epitaxial growth apparatuses mentioned above. The temperature for epitaxial growth of each of the epitaxial semiconductor buffer layer 28 and the epitaxial source/drain structure 30 typically ranges from 550° C. to 900° C. The bottom up epitaxial growth of each of the epitaxial semiconductor buffer layer 28 and the epitaxial source/drain structure 30 can be performed utilizing any well known precursor gas or gas mixture. Carrier gases like hydrogen, nitrogen, helium and argon can be used. In some circumstance, the bottom up epitaxy growth rate is much faster than lateral epitaxy growth rate from sidewall of the nanosheets, by applying a cyclic growth-etch back process, epitaxy growth can be controlled dominantly from bottom up growth.

In the case of the epitaxial source/drain structure 30, and in some embodiments of the present application, an n-type dopant or a p-type dopant can be included with the precursor gas during the bottom up epitaxial growth process. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In other embodiment, the dopant can be introduced into an intrinsic (i.e., non-doped) semiconductor layer that provides the epitaxial source/drain structure 30 by utilizing one of ion implantation or gas phase doping.

The epitaxial semiconductor buffer layer 28 is composed of an intrinsic semiconductor material. The semiconductor material that provides the epitaxial semiconductor buffer layer 28 is compositionally different from each of the recessed sacrificial semiconductor material nanosheets 15R and the bottommost sacrificial semiconductor material layer 14A of the nanosheet structure 12. The semiconductor material that provides the epitaxial semiconductor buffer layer 28 can be compositionally the same as, or compositionally different from, the exposed surface of the bottommost semiconductor channel material layer 16A of the at least one nanosheet structure 12. In one example, and when the recessed sacrificial semiconductor material nanosheets 15R and the bottommost sacrificial semiconductor material layer 14A of the nanosheet structure 12 are composed of a silicon germanium alloy, the bottommost semiconductor channel material layer 16A and the epitaxial semiconductor buffer layer 28 can be both composed of silicon. The epitaxial semiconductor buffer layer 28 does not contact any of the sidewalls of the semiconductor material channel nanosheets 17 of each of the nanosheet stacks 24.

The epitaxial source/drain structure 30 is composed of doped (n-type or p-type) semiconductor material. The content of the dopant within the epitaxial source/drain structure 30 can be from 1E18 atoms/cm$^3$ to 9E21 atoms/cm$^3$. The semiconductor material that provides the epitaxial source/drain structure 30 is compositionally different from each of the recessed sacrificial semiconductor material nanosheets 15R and the bottommost sacrificial semiconductor material layer 14A of the nanosheet structure 12. The semiconductor material that provides the epitaxial source/drain structure 30 can be compositionally the same as, or compositionally different from, the epitaxial semiconductor buffer layer 28 and/or the semiconductor channel material nanosheets 17. In one example, when the recessed sacrificial semiconductor material nanosheets 15R and the bottommost sacrificial semiconductor material layer 14A of the nanosheet structure 12 are composed of a silicon germanium alloy, the bottommost semiconductor channel material layer 16A, the epitaxial semiconductor buffer layer 28 and the epitaxial source/drain structure 30 are composed of silicon. The epitaxial source/drain structure 30 can have an entirely planar topmost surface, or it can have a faceted upper surface. The epitaxial source/drain structure 30 contacts a sidewall of each of the semiconductor channel material nanosheets 17 within a given nanosheet stack 24.

Figure 7:
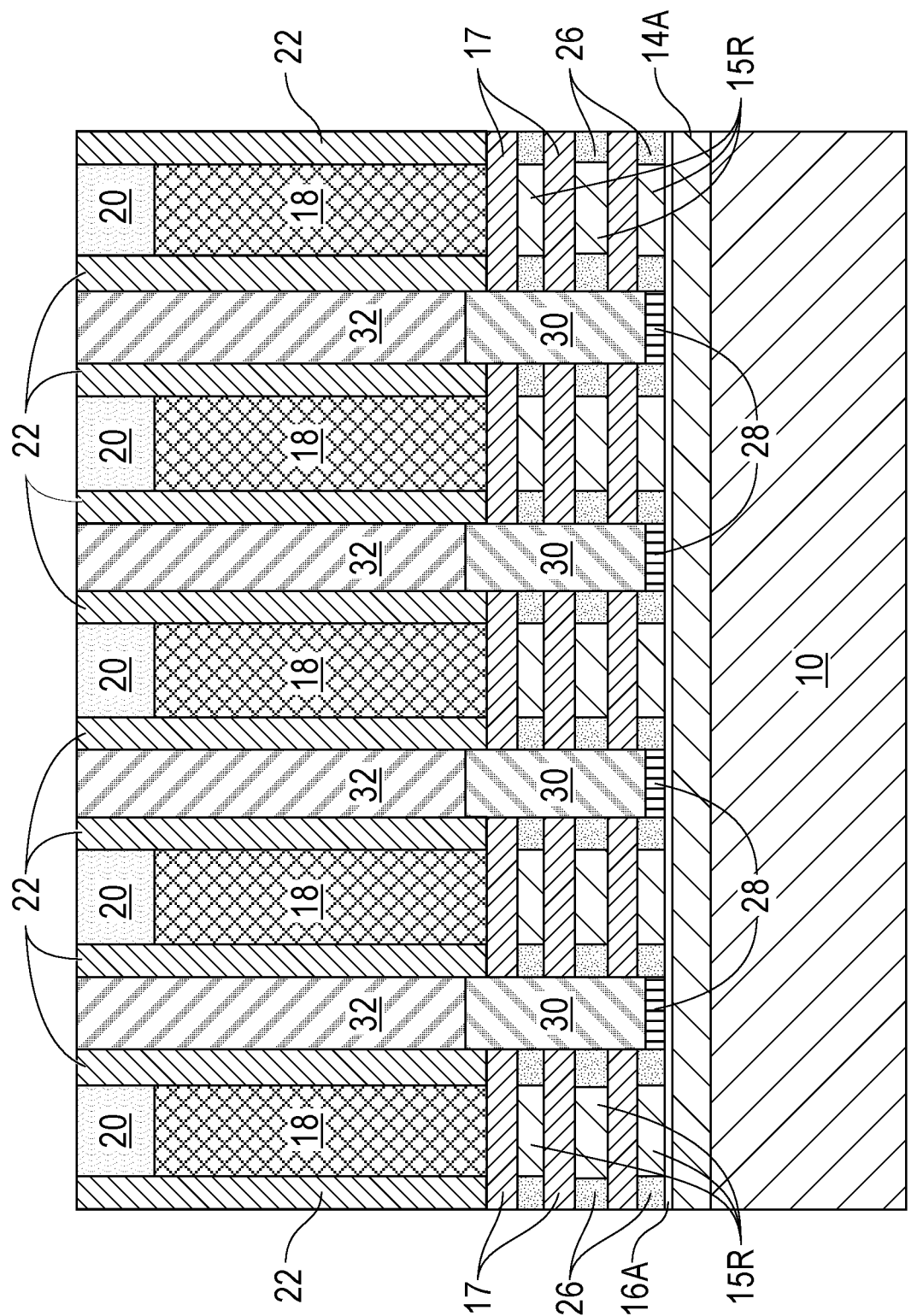
FIG. 7 is a X-X cross sectional view of the exemplary structure of FIG. 6 after forming an interlayer dielectric (ILD) material on the epitaxial source/drain structure.

Referring now to FIG. 7, there is illustrated the exemplary structure of FIG. 6 after forming an interlayer dielectric (ILD) material 32 on the epitaxial source/drain structure 30. The ILD material 32 has a topmost surface that is coplanar with a topmost surface of each of the sacrificial gate structures (18, 20) and the gate dielectric spacer 22.

The ILD material 32 can be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. In another embodiment, a self-planarizing material such as a spin-on glass (SOG) or a spin-on low-k dielectric material such as SiLK™ can be used as ILD material 32. The use of a self-planarizing dielectric material as the ILD material 32 can avoid the need to perform a subsequent planarizing step.

In one embodiment, the ILD material 32 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 32, a planarization process (such as, for example, chemical mechanical polishing (CMP)) or an etch back process follows the deposition of the dielectric material that provides the ILD material 32.

Figure 8A:
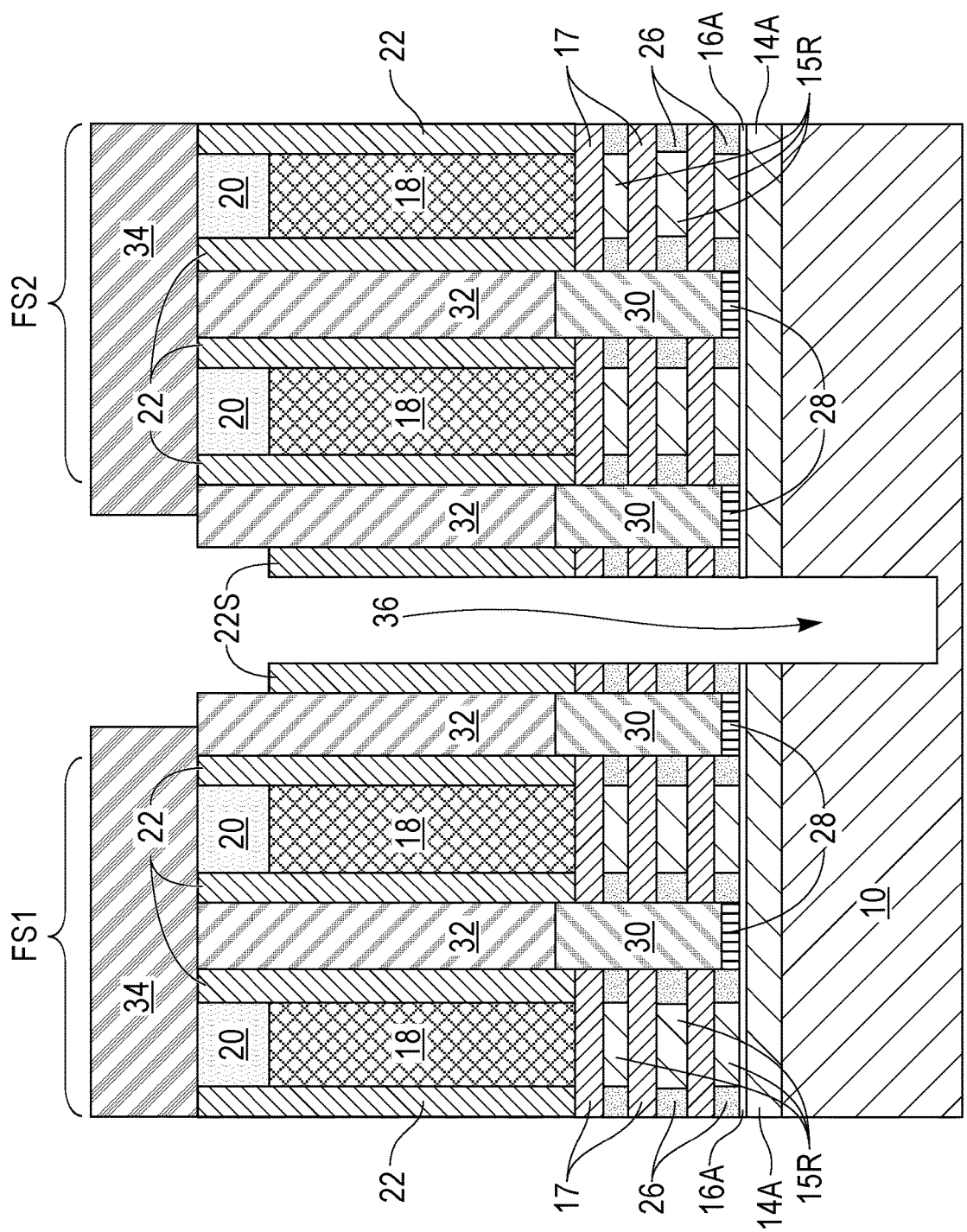
FIG. 8A is a X-X cross sectional view of the exemplary structure of FIG. 7 after forming a patterned organic planarization layer (OPL), removing one of the sacrificial gate structures, the underlying nanosheet stack, the underlying bottommost semiconductor channel material layer and the underlying bottommost sacrificial material layer to expose a portion of the semiconductor substrate, and forming a single diffusion break point trench in the semiconductor substrate by etching the exposed portion of the semiconductor substrate.

Referring now to FIGS. 8A-8B, there are shown the exemplary structure of FIG. 7 after forming a patterned organic planarization layer (OPL) 34, removing one of the sacrificial gate structures (18, 20), the underlying nanosheet stack 24, the underlying bottommost semiconductor channel material layer 16A and the underlying bottommost sacrificial material layer 14A, and forming a single diffusion break point trench 36. During the removal of the one of the sacrificial gate structures, the underlying nanosheet stack, the underlying bottommost semiconductor channel material layer 16A and the underlying bottommost sacrificial material layer 14A, the gate dielectric spacers 22 that were laterally adjacent to the removed sacrificial gate structures (18, 20) and the underlying nanosheet stack 24, is typically reduced. The reduced gate dielectric spacers 22 can be referred as a gate spacer 22S.

The patterned OPL 34 contains an opening that physically exposes one of the sacrificial gate structures. The patterned OPL 34 can be composed of an organic polymer that can include polyacrylate resin, epoxy resin, phenol resin, polyamide resin, polyimide resin, unsaturated polyester resin, polyphenylenether resin, polyphenylenesulfide resin, or benzocyclobutene (BCB. The patterned OPL 34 can be formed utilizing a deposition process such as, for example, CVD, PECVD or spin-on coating, followed by patterning process such as, for example, lithography and etching.

The removal of the one sacrificial gate structure (18, 20), the underlying nanosheet stack 24, the underlying bottommost semiconductor channel material layer 16A the underlying bottommost sacrificial material layer 14A, which occurs through the opening that is present in the patterned OPL 34, can include one or more anisotropic etching processes such as, for example, a reactive ion etch. This removal step physically exposed a portion of the semiconductor substrate 10.

The forming of the single diffusion break point trench 36 includes removing a portion of the semiconductor substrate 10 that is now physically exposed. The removal of the portion of the semiconductor substrate 10 can include an anisotropic etching process. In some embodiments, the removal of the one sacrificial gate structure (18, 20), the underlying nanosheet stack 24, the underlying bottommost semiconductor channel material layer 16A the underlying bottommost sacrificial material layer 14A and the formation of the single diffusion break point trench 36 occurs utilizing a single anisotropic etching process. The area of the exemplary structure that is located directly above the single diffusion break point trench 36 can be referred to as a single diffusion break point region.

The single diffusion break point trench 36 as well as the single diffusion break point region separate a first set of nanosheet stacks (FS1) of the plurality of nanosheet stacks (e.g., those to the left of the single diffusion break point trench 36 and the single diffusion break point region) from a second set of nanosheet stacks (FS2) of the plurality of nanosheet stacks (those to the right of the single diffusion break point trench 36 and the single diffusion break point region).

Figure 9:
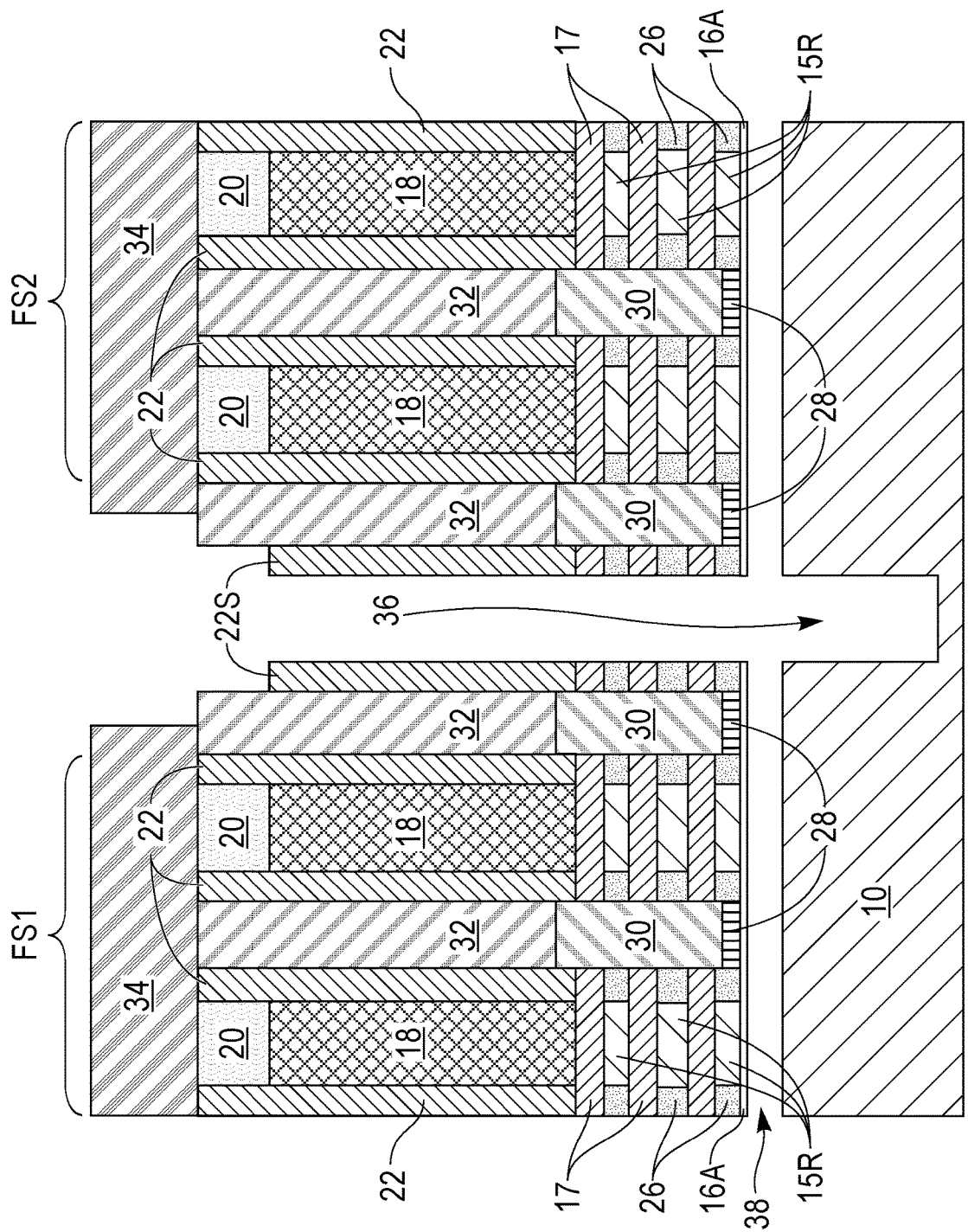
FIG. 9 is a X-X cross sectional view of the exemplary structure of FIG. 8A after removing the remaining bottommost sacrificial semiconductor material layer of the nanosheet structure.

Referring now to FIG. 9, there is illustrated the exemplary structure of FIGS. 8A-8B after removing the remaining bottommost sacrificial semiconductor material layer 14A of the nanosheet structure 12 to provide a cavity 38 beneath the remaining nanosheet stacks 24. The removal of the remaining bottommost sacrificial semiconductor material layer 14A includes a lateral etching process that is selective in removing the bottommost sacrificial semiconductor material layer 14A. The lateral etch occurs by contacting the sidewalls of the remaining bottommost sacrificial semiconductor material layer 14A with a chemical etchant; the remaining bottommost semiconductor channel material layer 16A protects the nanosheet stacks at this point of the present application. In one example, and when the bottommost sacrificial semiconductor material layer 14A is composed of a silicon germanium alloy, vapor phase hydrochloric (HCl) acid can be used to remove the remaining bottommost sacrificial semiconductor material layer 14A. It is noted that the remaining nanosheet stacks 24 are not floating. Instead, the remaining nanosheet stacks 24 are anchored to the semiconductor substrate 10 by the remaining sacrificial gate structures (18, 20).

Figure 10A:
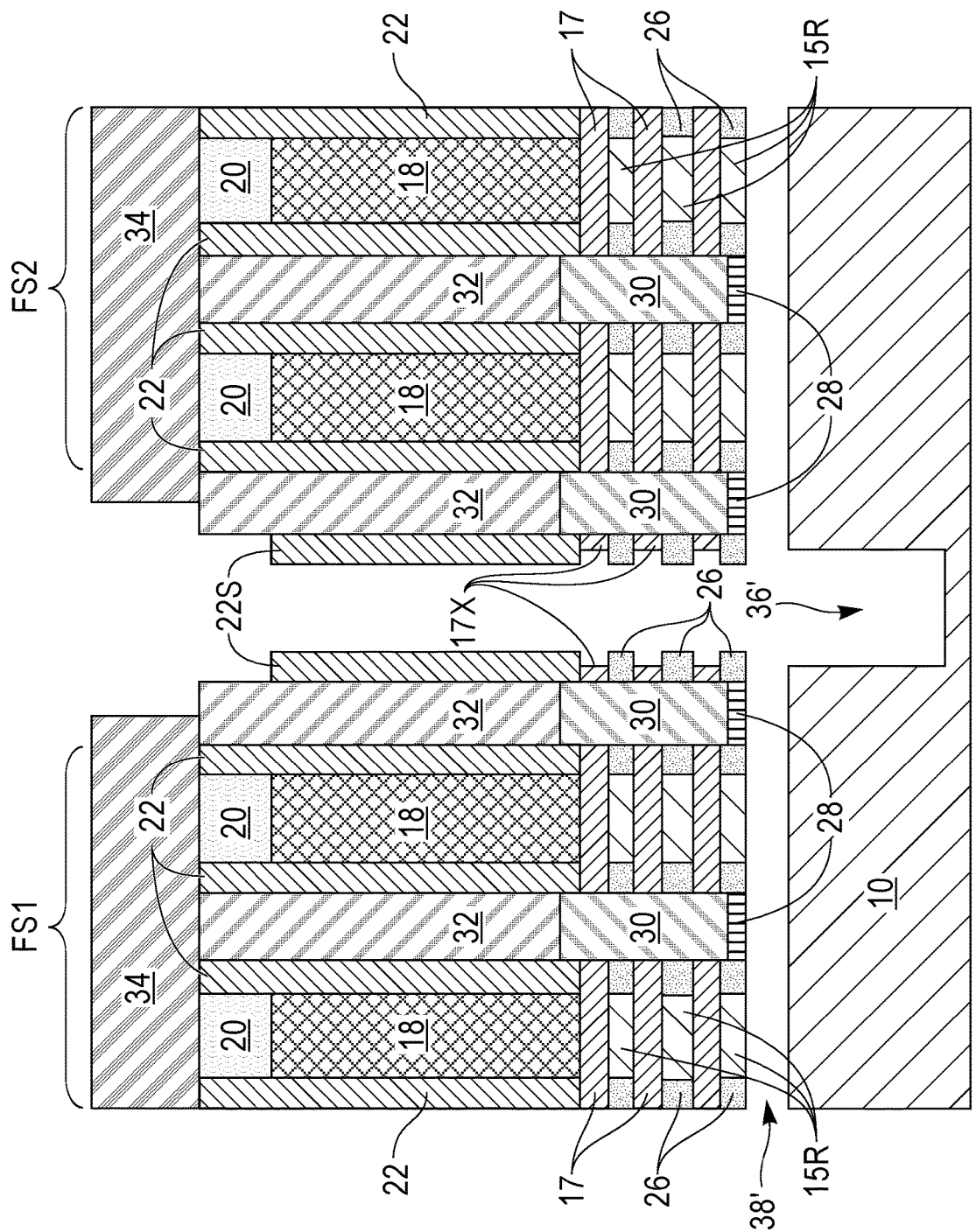
FIG. 10A is a X-X cross sectional view of the exemplary structure of FIG. 9 after performing an optional thinning step.

Referring now to FIGS. 10A-10B, there are illustrated the exemplary structure of FIG. 9 after performing an optional thinning step. The optional thinning step removes physically exposes portions of the semiconductor channel material nanosheets 17 (forming thinned semiconductor channel material nanosheets 17X, the remaining bottommost semiconductor channel material layer 16A, and expands the area of the single diffusion break point trench 36 and the area of the cavity 38 that is located beneath the remaining nanosheet stacks 24. The expanded area single diffusion break point trench is now labeled as 36', and the expanded area cavity is now labeled as 38'. In some embodiments, a trimming process can be performed during the replacement of the remaining functional gate structures with a functional gate structure. The trimming that provides the exemplary structure shown in FIGS. 10A-10B can include oxidation followed by etching.

Figure 11A:
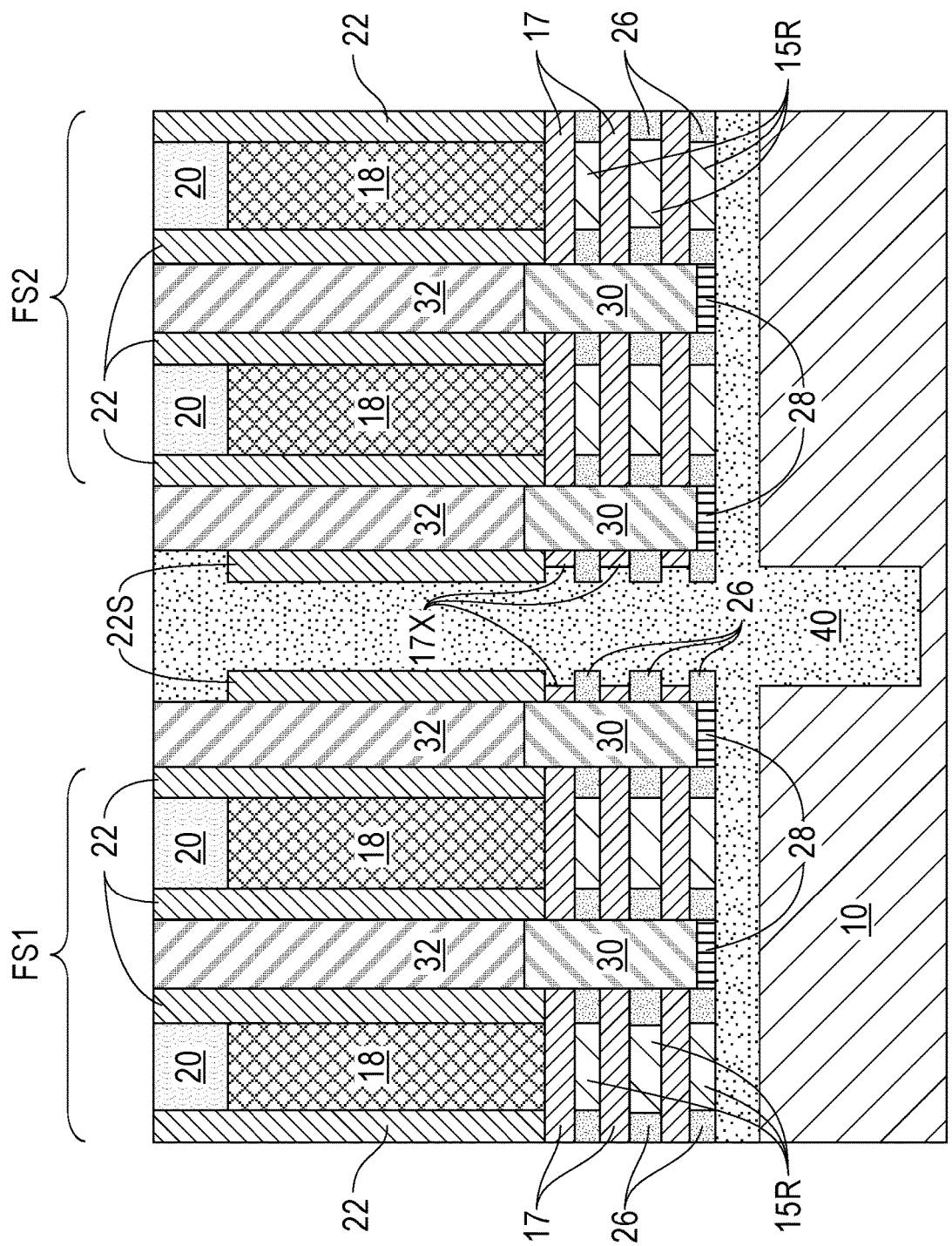
FIG. 11A is a X-X cross sectional view of the exemplary structure of FIG. 10A after removing the patterned OPL, and forming a bottom dielectric isolation structure in the single diffusion break point trench and the area previously occupied by the bottommost sacrificial semiconductor material of the at least one nanosheet structure.
Figure 11B:
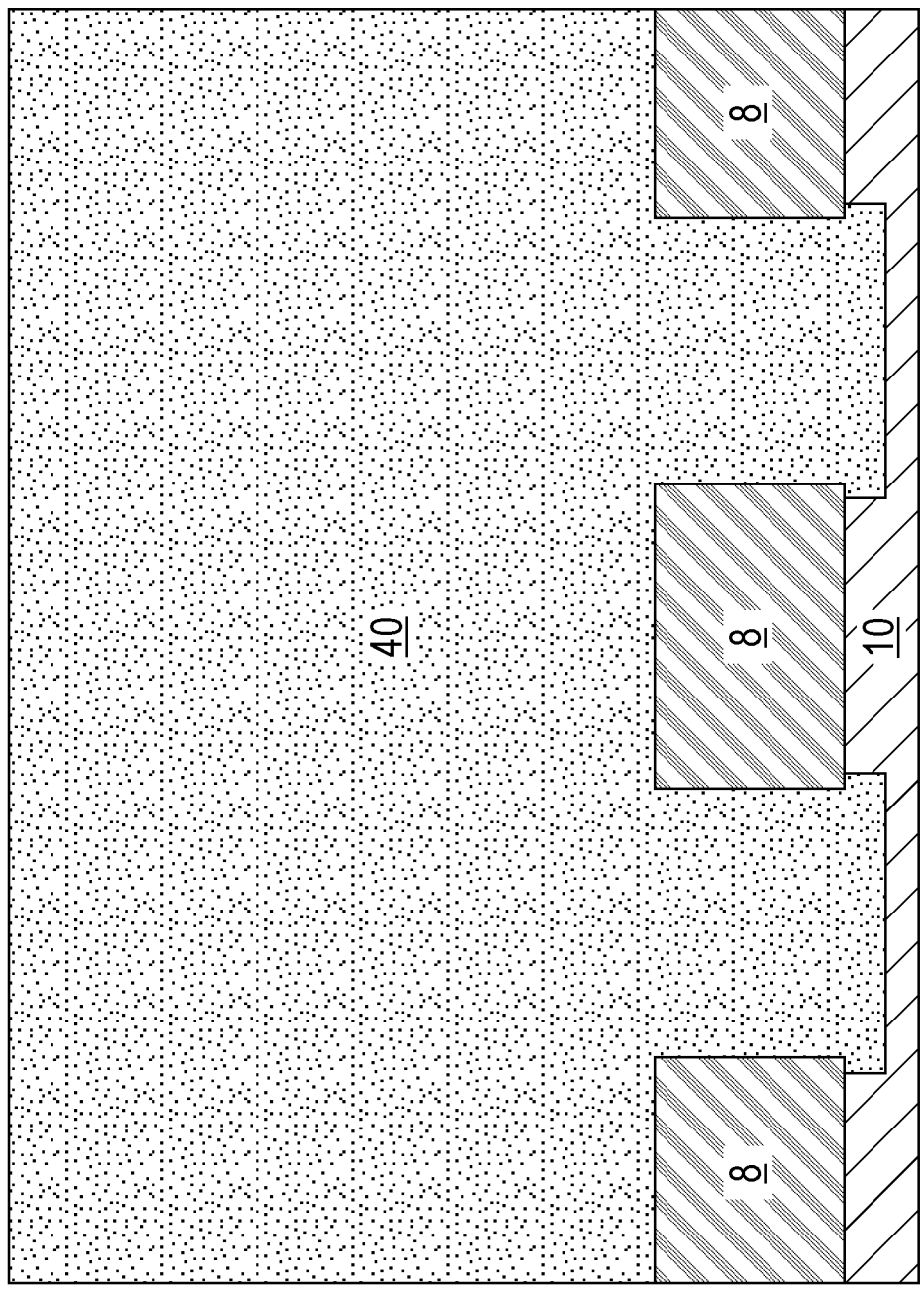
FIG. 11B is a Y-Y cross sectional view of the exemplary structure of FIG. 11A.

Referring now to FIGS. 11A-11B, there are illustrated the exemplary structure of FIGS. 10A-10B after removing the patterned OPL 34, and forming a bottom dielectric isolation structure 40 in the single diffusion break point trench 36 (or, if formed, the expended area single diffusion break point trench 36) or in the cavity 38 (or, if formed, the expanded area cavity 38'). Cavity 38 is the area previously occupied by the bottommost sacrificial semiconductor material of the at least one nanosheet structure.

The removal of the patterned OPL 34 can include any material removal process that is can remove the patterned OPL 34 from the structure. In one example, the patterned OPL 34 can be removed by an ash process.

The bottom dielectric isolation structure 40 is formed by depositing a dielectric material such as, silicon dioxide, SiN, SiOC, SiOCN, etc, and then performing a planarization process such as, for example, chemical mechanical polishing (CMP). In one embodiment, the bottom dielectric isolation structure 40 is formed by depositing a flowable oxide material.

The bottom dielectric isolation structure 40 is of unitary construction, i.e. a single piece, and is composed of a same dielectric material. The bottom dielectric isolation structure 40 is located entirely within cavity 38 (or, if formed, the expanded area cavity 38') that is located beneath the remaining nanosheet stacks 24, entirely within in the single diffusion break point trench 36 (or, if formed, the expended area single diffusion break point trench 36') and within the area previous including the removed sacrificial gate structure and underlying nanosheet stack (i.e., the single diffusion break point region).

Figure 12:
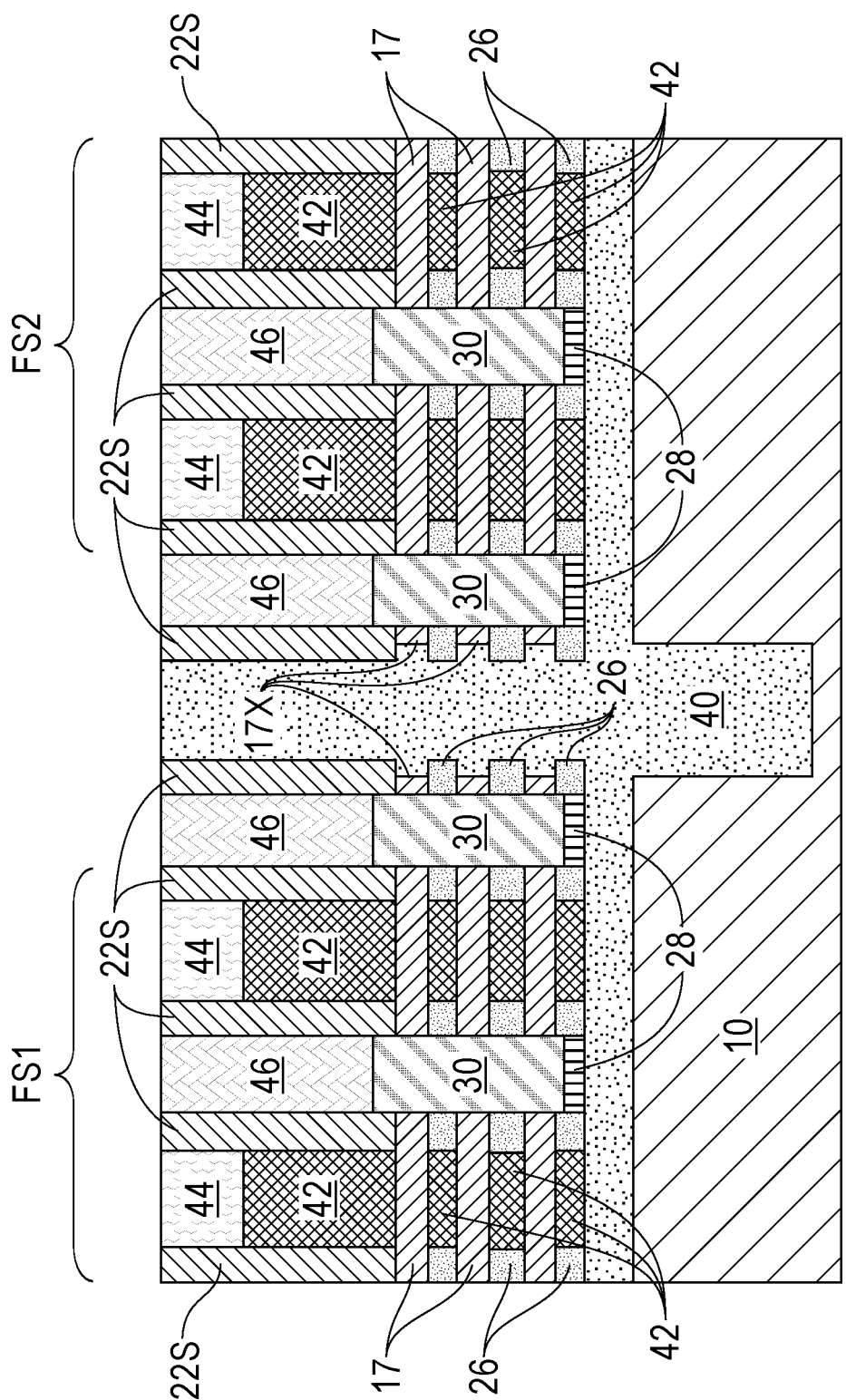
FIG. 12 is a X-X cross sectional view of the exemplary structure of FIG. 11A after removing the remaining sacrificial gate structures and each recessed sacrificial semiconductor material nanosheet so as to suspend a portion of each semiconductor channel material nanosheet, forming a functional gate structure above and below the suspended portion of each semiconductor channel material nanosheet, and forming a contact structure contacting the epitaxial source/drain structure.

Referring now to FIG. 12, there is illustrated the exemplary structure of FIGS. 11A-11B after removing the remaining sacrificial gate structure (18, 20) and each recessed sacrificial semiconductor material nanosheet 15R so as to suspend a portion of each semiconductor channel material nanosheet 17, forming a functional gate structure 42 above and below the suspended portion of each semiconductor channel material nanosheet 17, and forming a contact structure 46 contacting the epitaxial source/drain structure 30.

The removal of the remaining sacrificial gate structures (18, 20) can be performed utilizing one or more anisotropic etching processes that are selective in removing the materials that provide the sacrificial gate structure (18, 20). During this step, the height of the remaining gate dielectric spacers 22 can be reduced to provide gate spacers 22S. The reduction of the height of the remaining gate dielectric spacers 22 can occur after formation of the functional gate structure 42. As is shown, the gate spacers 22S are located laterally adjacent to an upper portion of the functional gate structure 42.

Next, each semiconductor channel material nanosheet 17 is suspended by selectively etching each recessed sacrificial semiconductor material nanosheet 15R relative to each semiconductor channel material nanosheet 17. A functional gate structure 42 is then formed in each gate cavity and surrounding a physically exposed portion of each of the now suspended semiconductor channel material nanosheets 17. As is shown, a bottommost surface of the functional gate structure 42 directly contacts a surface of the bottom dielectric isolation structure 40 that is located beneath the suspended semiconductor channel material nanosheet 17. By "functional gate structure" it is meant a permanent gate structure used to control output current (i.e., flow of carriers in the channel) of a semiconducting device through electrical or magnetic fields.

The functional gate structure 42 can include a gate dielectric portion (not shown) and a gate conductor portion (not shown). The gate dielectric portion can include a gate dielectric material. The gate dielectric material that provides the gate dielectric portion can be an oxide, nitride, and/or oxynitride. In one example, the gate dielectric material that provides the gate dielectric portion can be a high-k material having a dielectric constant greater than 4.0. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion.

The gate dielectric material used in providing the gate dielectric portion can be formed by any deposition process including, for example, CVD, PECVD, PVD, sputtering, or ALD. In one embodiment of the present application, the gate dielectric material used in providing the gate dielectric portion can have a thickness in a range from 1 nm to 10 nm. Other thicknesses that are lesser than, or greater than, the aforementioned thickness range can also be employed for the gate dielectric material that can provide the gate dielectric portion.

The gate conductor portion can include a gate conductor material. The gate conductor material used in providing the gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion can comprise an nFET gate metal. In another embodiment, the gate conductor portion can comprise a pFET gate metal. When multiple gate cavities are formed, it is possible to form a nFET in a first set of the gate cavities and wrapping around some of the semiconductor channel material nanosheet 17 and a pFET in a second set of the gate cavities and wrapping around some of the semiconductor channel material nanosheet 17.

The gate conductor material used in providing the gate conductor portion can be formed utilizing a deposition process including, for example, CVD, PECVD, PVD, sputtering, ALD or other like deposition processes. When a metal silicide is formed, a conventional silicidation process is employed. In one embodiment, the gate conductor material used in providing the gate conductor portion can have a thickness from 50 nm to 200 nm. Other thicknesses that are lesser than, or greater than, the aforementioned thickness range can also be employed for the gate conductor material used in providing the gate conductor portion.

The functional gate structure 42 can be formed by providing a functional gate material stack of the gate dielectric material, and the gate conductor material. A planarization process can follow the formation of the functional gate material stack. In some embodiments, and as shown, a gate cap 44 can be formed on the functional gate structure 42. The gate cap 44 includes one of the hard mask materials mentioned above for the sacrificial gap 20. The gate cap 44 can be formed by a deposition process followed by a planarization process.

Next, the contact structure 46 is formed. The contact structure 46 is formed by forming a contact opening (not shown) in the ILD material 32 and then filling the contact opening with a bottom silicide (e.g., Ti silicide, Ni silicide, NiPt silicide) and contact metal (e.g., Ru, Cu, W, Al, or Co) or metal alloy (e.g., a Cu—Al alloy). A planarization process can follow the filling of the contact opening providing the exemplary structure shown in FIG. 12. As is shown, the contact structure 46 has a topmost surface that is coplanar with a topmost surface of the gate cap 44 that is located on the functional gate structure 42.

Referring back to FIG. 12, there is illustrated an exemplary semiconductor structure of the present application. The exemplary structure includes a plurality of nanosheet stacks 24 composed of suspended semiconductor channel material nanosheets 17 located above a semiconductor substrate 10, wherein a single diffusion break point trench (36, 36') is present in the semiconductor substrate 10 and separates a first set of nanosheet stacks (FS1) of the plurality of nanosheet stacks from a second set of nanosheet stacks (FS2) of the plurality of nanosheet stacks. A functional gate structure 42 surrounds a portion of each semiconductor channel material nanosheet 17 of the plurality of nanosheet stacks 24. An epitaxial source/drain (S/D) structure 30 is located on each side of the functional gate structure 42 and physically contacts a sidewall of each semiconductor channel material nanosheet 17 of the plurality of nanosheet stacks 24. A bottom dielectric isolation structure 40 is located beneath each of the nanosheet stacks of the plurality of nanosheet stacks 24 and is present in the single diffusion break point trench (36, 36').

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a plurality of nanosheet stacks composed of suspended semiconductor channel material nanosheets located above a semiconductor substrate, wherein a single diffusion break point trench is present in the semiconductor substrate and separates a first set of nanosheet stacks of the plurality of nanosheet stacks from a second set of nanosheet stacks of the plurality of nanosheet stacks;
   a functional gate structure surrounding a portion of each semiconductor channel material nanosheet of the plurality of nanosheet stacks;
   an epitaxial source/drain (S/D) structure located on each side of the functional gate structure and physically contacting a sidewall of each semiconductor channel material nanosheet of the plurality of nanosheet stacks; and
   a bottom dielectric isolation structure located beneath each of the nanosheet stacks of the plurality of nanosheet stacks and present in the single diffusion break point trench, wherein the epitaxial S/D structure is entirely spaced apart from the bottom dielectric isolation structure.

2. The semiconductor structure of claim 1, wherein a portion of the bottom dielectric isolation structure is present in a single diffusion break point region that is located directly above the single diffusion break point trench.

3. The semiconductor structure of claim 2, wherein the bottom dielectric isolation structure is of unitary construction and composed of a single dielectric material.

4. The semiconductor structure of claim 1, further comprising a contact structure contacting a surface of the epitaxial S/D structure.

5. The semiconductor structure of claim 1, further comprising inner gate spacers contacting sidewalls of the functional gate structure and located on an outer portion of each semiconductor channel material nanosheet of the plurality of nanosheet stacks.

6. The semiconductor structure of claim 1, further comprising a gate spacer located laterally adjacent to an upper portion of the functional gate structure.

7. The semiconductor structure of claim 1, wherein the semiconductor channel material nanosheets of the plurality of nanosheet stacks and the semiconductor substrate are composed of a same semiconductor material.

8. The semiconductor structure of claim 1, wherein a bottommost surface of the functional gate structure directly contacts a surface of the bottom dielectric isolation structure that is located beneath each nanosheet stack of the plurality of nanosheet stacks.

9. A semiconductor structure comprising:
   a plurality of nanosheet stacks composed of suspended semiconductor channel material nanosheets located above a semiconductor substrate, wherein a single diffusion break point trench is present in the semiconductor substrate and separates a first set of nanosheet stacks of the plurality of nanosheet stacks from a second set of nanosheet stacks of the plurality of nanosheet stacks;
   a functional gate structure surrounding a portion of each semiconductor channel material nanosheet of the plurality of nanosheet stacks;
   an epitaxial source/drain (S/D) structure located on each side of the functional gate structure and physically contacting a sidewall of each semiconductor channel material nanosheet of the plurality of nanosheet stacks;
   a bottom dielectric isolation structure located beneath each of the nanosheet stacks of the plurality of nanosheet stacks and present in the single diffusion break point trench; and
   an epitaxial semiconductor buffer layer located directly beneath an entirety of the epitaxial S/D structure, and on a surface of the bottom dielectric isolation structure.

10. The semiconductor structure of claim 9, wherein the epitaxial semiconductor buffer layer is composed of an intrinsic semiconductor material and the epitaxial S/D structure is composed of a doped semiconductor material.

11. A method of forming a semiconductor structure, the method comprising:
    forming a plurality of sacrificial gate structures on at least one nanosheet structure that is present on a surface of a semiconductor substrate, wherein the at least one nanosheet structure is composed of a vertical stack of alternating sacrificial semiconductor material layers and semiconductor channel material layers;
    recessing a portion of the at least one nanosheet structure to provide at least one nanosheet stack of alternating sacrificial semiconductor material nanosheets and semiconductor channel material nanosheets;
    recessing each sacrificial semiconductor material nanosheet to provide recessed sacrificial semiconductor nanosheets;
    forming an epitaxial semiconductor buffer layer on an exposed surface of a bottommost semiconductor channel material layer of the at least one nanosheet structure that is located between each nanosheet stack;
    forming an epitaxial source/drain structure on the epitaxial semiconductor buffer layer;
    removing one of the sacrificial gate structures, the underlying nanosheet stack, the underlying bottommost semiconductor channel material layer and the underlying bottommost sacrificial material layer to expose a portion of the semiconductor substrate;
    forming a single diffusion break point trench in the semiconductor substrate by etching the exposed portion of the semiconductor substrate;
    removing the remaining bottommost sacrificial semiconductor material layer of the nanosheet structure to provide a cavity beneath the remaining nanosheet stacks; and
    forming a bottom dielectric isolation structure in the single diffusion break point trench and the cavity that is located beneath the remaining nanosheet stacks.

12. The method of claim 11, further comprising:
removing the remaining sacrificial gate structures and each recessed sacrificial semiconductor material nanosheet to suspend a portion of each semiconductor channel material nanosheet; and
forming a functional gate structure above and below the suspended portion of each semiconductor channel material nanosheet.

13. The method of claim 12, further comprising:
forming a contact structure contacting the epitaxial source/drain structure.

14. The method of claim 11, wherein the forming of the epitaxial semiconductor buffer layer comprises a bottom up epitaxial growth process.

15. The method of claim 11, wherein the forming of the epitaxial source/drain structure comprises a bottom up epitaxial growth process.

16. The method of claim 11, wherein a portion of the bottom dielectric isolation structure is present in a single diffusion break point region that includes an area comprises the removed sacrificial gate structure and the removed underlying nanosheet stack.

17. The method of claim 16, wherein the bottom dielectric isolation structure is of unitary construction and composed of a single dielectric material.

18. The method of claim 11, wherein the removing of the sacrificial gate structure, the underlying nanosheet stack, the underlying bottommost semiconductor channel material layer and the underlying bottommost sacrificial material layer comprises one or more anisotropic etching processes.

19. The method of claim 11, wherein the forming the single diffusion break point trench in the semiconductor substrate comprises an anisotropic etching process.

20. The method of claim 11, further comprising:
performing a thinning step to expand the single diffusion break point trench and the cavity.

* * * * *